United States Patent
Braun et al.

(10) Patent No.: US 8,901,000 B2
(45) Date of Patent: Dec. 2, 2014

(54) AQUEOUS ACIDIC SOLUTION AND ETCHING SOLUTION AND METHOD FOR TEXTURIZING THE SURFACE OF SINGLE CRYSTAL AND POLYCRYSTAL SILICON SUBSTRATES

(75) Inventors: Simon Braun, Mannheim (DE);
Andreas Klipp, Lambsheim (DE);
Cornelia Roeger-Goepfert, Schwetzingen (DE); Christian Bittner, Bensheim (DE); MeiChin Shen, Taoyuan (TW); Chengwei Lin, Tapei County (TW)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/817,935

(22) PCT Filed: Aug. 25, 2011

(86) PCT No.: PCT/IB2011/053728
§ 371 (c)(1),
(2), (4) Date: Feb. 20, 2013

(87) PCT Pub. No.: WO2012/029000
PCT Pub. Date: Mar. 8, 2012

(65) Prior Publication Data
US 2013/0171765 A1 Jul. 4, 2013

Related U.S. Application Data

(60) Provisional application No. 61/378,950, filed on Sep. 1, 2010.

(51) Int. Cl.
*H01L 31/18* (2006.01)
*H01L 21/306* (2006.01)
*C09K 13/08* (2006.01)
*H01L 31/0236* (2006.01)
*H01L 31/0224* (2006.01)

(52) U.S. Cl.
CPC ..... *H01L 21/30604* (2013.01); *H01L 21/30608* (2013.01); *H01L 31/022425* (2013.01); *C09K 13/08* (2013.01); *H01L 31/02363* (2013.01); *H01L 31/18* (2013.01); *Y02E 10/50* (2013.01)
USPC ........................................................ 438/689

(58) Field of Classification Search
CPC ................. H01L 31/022425; H01L 31/20236; H01L 21/30608
USPC ........................................................ 438/689
See application file for complete search history.

(56) References Cited

U.S. PATENT DOCUMENTS

| 4,243,473 A | | 1/1981 | Yamaguchi et al. | |
|---|---|---|---|---|
| 6,156,968 A | * | 12/2000 | Nishimoto et al. | 136/252 |
| 6,340,640 B1 | * | 1/2002 | Nishimoto et al. | 438/753 |
| 6,391,145 B1 | * | 5/2002 | Nishimoto et al. | 156/345.12 |
| 6,890,452 B2 | * | 5/2005 | Parent et al. | 252/79.1 |
| 7,091,132 B2 | * | 8/2006 | Tan et al. | 438/745 |
| 7,192,885 B2 | | 3/2007 | Hauser et al. | |
| 7,377,991 B2 | * | 5/2008 | Tan et al. | 156/345.1 |
| 8,129,212 B2 | * | 3/2012 | Wijekoon et al. | 438/71 |
| 2004/0099290 A1 | * | 5/2004 | Morinaga et al. | 134/27 |
| 2005/0016959 A1 | * | 1/2005 | Tan et al. | 216/83 |
| 2006/0040838 A1 | * | 2/2006 | Shimada et al. | 510/175 |
| 2006/0122083 A1 | * | 6/2006 | Tamura | 510/175 |
| 2006/0183297 A1 | | 8/2006 | Mun et al. | |
| 2006/0243390 A1 | * | 11/2006 | Tan et al. | 156/345.11 |
| 2007/0151944 A1 | * | 7/2007 | Du | 216/24 |
| 2009/0023265 A1 | | 1/2009 | Mun et al. | |
| 2009/0149025 A1 | * | 6/2009 | Miyamoto et al. | 438/694 |
| 2009/0280597 A1 | * | 11/2009 | Wijekoon et al. | 438/71 |
| 2010/0055822 A1 | | 3/2010 | Weidman et al. | |
| 2010/0239818 A1 | * | 9/2010 | Lee et al. | 428/156 |
| 2010/0304527 A1 | | 12/2010 | Borden et al. | |
| 2011/0021023 A1 | * | 1/2011 | Letize et al. | 438/674 |
| 2011/0183458 A1 | | 7/2011 | Weidman et al. | |
| 2011/0272625 A1 | | 11/2011 | Wijekoon et al. | |

FOREIGN PATENT DOCUMENTS

| CN | 1696349 | 11/2005 |
|---|---|---|
| CN | 1865542 | 11/2006 |
| DE | 197 46 706 | 11/1998 |

(Continued)

OTHER PUBLICATIONS

International Search Report Issued Jan. 5, 2012 in PCT/IB11/53728 Filed Aug. 25, 2011.
Chinese Office Action issued Sep. 28, 2014, in corresponding Application No. 201180042294.9 (English translation only).

*Primary Examiner* — Gregory Webb
(74) *Attorney, Agent, or Firm* — Oblon, Spivak, McClelland, Maier & Neustadt, L.L.P.

(57) ABSTRACT

An aqueous acidic solution and an aqueous acidic etching solution suitable for texturizing the surface of single crystal and polycrystal silicon substrates, hydrofluoric acid; nitric acid; and at least one anionic polyether, which is surface active; a method for texturizing the surface of single crystal and polycrystal silicon substrates comprising the step of (1) contacting at least one major surface of a substrate with the said aqueous acidic etching solution; (2) etching the at least one major surface of the substrate for a time and at a temperature sufficient to obtain a surface texturization consisting of recesses and protrusions; and (3) removing the at least one major surface of the substrate from the contact with the aqueous acidic etching solution; and a method for manufacturing photovoltaic cells and solar cells using the said solution and the said texturizing method.

31 Claims, No Drawings

(56) References Cited

FOREIGN PATENT DOCUMENTS

| JP | 3916526 | 5/2007 |
| KR | 10 2009 0007127 | 1/2009 |
| WO | 2009 119995 | 10/2009 |
| WO | 2009 120631 | 10/2009 |

* cited by examiner

AQUEOUS ACIDIC SOLUTION AND ETCHING SOLUTION AND METHOD FOR TEXTURIZING THE SURFACE OF SINGLE CRYSTAL AND POLYCRYSTAL SILICON SUBSTRATES

This application is a 371 of PCT/IB2011/053728 filed Aug. 25, 2011, and claims benefit of U.S. provisional application Ser. No. 61/378,950, filed Sep. 1, 2010.

FIELD OF THE INVENTION

The present invention is directed to a novel aqueous acidic solution and a novel aqueous acidic etching solution useful for texturizing the surface of single crystal and polycrystal silicon substrates. Moreover, the present invention is directed to a novel method for texturizing the surface of single crystal and polycrystal silicon substrates making use of the novel aqueous acidic etching solution.

CITED DOCUMENTS

The documents cited in the present application are incorporated by reference in their entirety.

BACKGROUND OF THE INVENTION

As is known in the art, single crystal and polycrystal silicon wafers can be produced in accordance with known and customary methods. Thus, single crystal and polycrystal silicon wafers can be manufactured by cutting silicon ingots or bricks. The single crystal ingots are e.g. grown with the Czochralski (CZ) method, by slowly pulling a seed shaft out of molten silicon, which is contained in a fusion furnace. The polycrystalline silicon can be produced by heating silicon pieces in a crucible just above their melting temperature. This lets the silicon pieces grow together forming a massive silicon block. This block is cut into bricks. The ingots or bricks are finally cut into wafers with wire saws. However, a saw damage etch must be carried out after the sawing since the crystal defects having a depth of several pm are centers for the recombination of electron-hole pairs. Customarily, aqueous acidic etching solutions comprising hydrofluoric acid and nitric acid are used for this purpose.

After the removal of the saw damage, the surface of the silicon wafers is texturized by the aqueous acidic etching solution, preferably, until an etching depth of 4 to 5 μm is reached.

Texturizing consists in creating a certain roughness at the surface of a substrate in order to enable multiple reflection of light incident on its surface, thereby leading to greater absorption of the light inside the substrate, i.e., to an increased light-confining effect. The roughness obtained in this way has two complementary effects: the first effect is to reduce the reflecting power or optical reflectivity of the surface; the second effect is to increase the length of the optical path travelled by the incident light inside the substrate. In a photocell, photovoltaic cell or solar cell, the increased light-confining effect gives rise to an increase in the effectiveness with which light is transformed into electricity.

However, the aqueous acidic etching solutions containing hydrofluoric acid and nitric acid frequently etch surface defects such as grain boundaries faster and deeper than other areas of the wafer surface, which is referred to as grain boundary etching in the art. This way, several micrometer deep grooves appear simultaneously on both sides of the wafers thus reducing their thickness drastically at these positions. This deleterious effect causes a considerable mechanical weakness in the wafers which leads to an increased breakage rate.

These undesirable grooves caused by defect etching appear as clearly visible black lines at the surface of the wafers.

Another problem of the aqueous acidic etching solutions containing hydrofluoric acid and nitric acid is their comparatively short bath lifetime which decreases the throughput of wafers and increases the costs of production. To accommodate this, some or all components of a texturization bath are feed into the bath. This often happens over a feed and bleed mechanism.

Thus, as the active components are replenished in the bath, the amount of silicon dissolved in the bath is increasing over time until a certain level is reached. It is believed that the reduced bath lifetime is caused by accumulation of the silicium in the form of hexafluorosilicic acid during the etching process. Only if this challenge is met a production of several 100,000 or millions of wafers in a single bath is possible.

In order to ameliorate these problems and drawbacks, aqueous acidic etching solutions comprising hydrofluoric acid and nitric acid have been developed, which solutions contain various surface active additives.

Thus, the American patent U.S. Pat. No. 6,340,640 B1 or the German patent application DE 197 46 706 A1 disclose an acidic etching solution containing 12 parts by volume of 50% by weight of hydrofluoric acid, one part by volume of 69% by weight of nitric acid and 12 parts by volume of 85% by weight of phosphoric acid. Instead of the phosphoric acid, a carboxylic acid having a higher molecular weight than acetic acid can be used. Additionally, the acidic etching solution can also contain anionic, cationic, nonionic or amphoteric surfactants, which surfactants are not specified nearer.

The international patent application WO 2009/119995 A2 discloses an aqueous acidic etching solution containing hydrofluoric acid, nitric acid and fluorine containing surfactants. Zonyl™ VSO-100 can be used as the fluorine surfactant. However, this fluorine surfactant is a nonionic surfactant.

The Japanese patent 3916526 B discloses an aqueous acidic etching solution containing hydrofluoric acid, nitric acid and a nonionic surfactant such as a polyoxyalkylene alkyl ether such as polyoxyethylene nonylphenyl ether.

The Korean patent application KR 10-2009-0007127 discloses an aqueous acidic etching solution containing hydrofluoric acid, and nonionic surfactants such as Triton™.

The Chinese patent application CN 1865542 A discloses various aqueous acidic etching solutions containing inter alia and nitric acid and ethanol, ethylene glycol, glycerol and n-butanol as the additive.

However, these prior art aqueous acidic etching solutions are not capable of ameliorating all of the above mentioned problems and drawbacks.

OBJECTS OF THE INVENTION

It was an object of the present invention to provide a novel in aqueous acidic solution and a novel aqueous acidic etching solution which is particularly suitable for saw damage etch removal and texturizing the surface of single crystal and polycrystal silicon substrates or wafers and does no longer exhibit the drawbacks of the prior art aqueous acidic etching solutions.

In particular, the novel aqueous acidic etching solution should exhibit an improved and a particularly well-balanced property profile in order to meet the increasing demands of the solar cells industry and its customers. Furthermore, for aesthetic reasons, a more uniform color of the etched silicon substrates or wafers and of the solar cells manufactured therefrom should be achieved by way of the novel aqueous acidic etching solution. Additionally, the novel aqueous acidic etching solution should exhibit a much less pronounced grain boundary etching or defect etching, including the etching of crystal dislocation clusters, in order to improve the stability of the silicon wafers and of the solar cells, in particular during their production and handling. Moreover, by way of the novel aqueous acidic etching solution, a surface texturization should be achieved that reflects only a very low amount of light and can be very well passivated and contacted by the front and back side contacts of the solar cell. In addition to this, the novel aqueous acidic etching solution should have a long bath life so that the throughput of wafers can be increased significantly and the costs of production significantly decreased.

Last but not least, the novel aqueous acidic etching solution should cause an increase of the efficiencies of the photovoltaic cells or solar cells manufactured from the silicon wafers texturized with the said solution.

It was another object of the invention to provide a novel method for texturizing the surface of single crystal and polycrystal silicon substrates or wafers, which novel method does no longer exhibit the drawbacks of the prior art methods. In particular, the novel method should meet the increasing demands of the solar cells industry and its customers. Furthermore, the novel method should yield etched silicon substrates or wafers with an improved uniform color so that, in turn, solar cells having also an improved uniform color can be produced. This is particularly important, when such solar cells are to be used in urban areas. Additionally, the novel method should lead to a much less pronounced grain boundary etching and to a significantly higher stability of the silicon wafers and of the solar cells produced therefrom, in particular during their production and handling. Moreover, the novel process should yield a surface texturization that reflects only a very low amount of light and can be very well passivated and contacted by the front and back side contacts of the solar cell. In addition to this, the novel process should exhibit a high throughput of wafers and low production costs.

Last but not least, the novel method should yield texturized silicon wafers which, in turn, yield photovoltaic cells or solar cells with increased efficiencies.

The novel aqueous acidic solution should be particularly suitable for single-sided etching processes and the production of debonding areas in the manufacture of devices generating electricity upon the exposure to electromagnetic radiation, for the production of rough surfaces as used in wafer bonding processes, for the production of bactericidal structures, and of the production of anti-adhesive structures.

SUMMARY OF THE INVENTION

Accordingly, the novel aqueous acidic solution containing
hydrofluoric acid;
nitric acid; and
at least one anionic polyether, which is surface active,
has been found.

Hereinafter, the novel aqueous acidic solution is referred to as the "solution of the invention".

Accordingly, the novel aqueous acidic etching solution has been found, the said solution being suitable for texturizing the surface of single crystal and polycrystal silicon substrates and containing
hydrofluoric acid;
nitric acid; and
at least one anionic polyether, which is surface active.

Hereinafter, the novel aqueous acidic etching solution is referred to as the "etching solution of the invention".

Moreover, the novel method for texturizing the surface of single crystal and polycrystal silicon substrates has been found, the said method comprising the steps of (1) contacting at least one major surface of a single crystal or polycrystal silicon substrate with an aqueous acidic etching solution containing
hydrofluoric acid;
nitric acid; and
at least one anionic polyether, which is surface active;

(2) etching the at least one major surface of a single crystal or polycrystal silicon substrate for a time and at a temperature sufficient to obtain a surface texturization consisting of recesses and protrusions; and (3) removing the at least one major surface of the single crystal or polycrystal silicon substrate from the contact with the aqueous acidic etching solution.

Hereinafter the novel method for texturizing the surface of a single crystal or polycrystal substrate is referred to as the "method of the invention".

Moreover, a new method for manufacturing devices generating electricity upon the exposure to electromagnetic radiation has been found, which makes use of the etching solution of the invention and the method of the invention and which is hereinafter referred to as the "manufacturing method of the invention".

Last but not least, the novel use of the etching solution of the invention for manufacturing electrical, mechanical and optical devices and the novel use of anionic polyether, which is surface active, for manufacturing devices which generate electricity upon exposure to electromagnetic radiation have been found, which uses are hereinafter referred to as the "uses of the invention".

Advantages of the Invention

In view of the prior art discussed above, it was surprising and could not be expected by the skilled artisan that the objects underlying the present invention could be solved by the etching solution, the method, the manufacturing method and the uses of the invention.

Thus, it was surprising that the etching solution of the invention no longer exhibited the drawbacks of the prior art etching solutions.

In particular, the etching solution of the invention exhibited an improved and a particularly well-balanced property profile in order to meet the increasing demands of the solar cells industry and its customers. Furthermore, for aesthetic reasons, a more uniform color of the etched silicon substrates or wafers and of the solar cells manufactured therefrom could be achieved by way of the etching solution. Additionally, the etching solution of the invention exhibited a much less pronounced grain boundary etching or defect etching, including the etching of crystal dislocation clusters, so that the stability of the silicon wafers and of the solar cells, in particular during their production and handling, was significantly improved. Moreover, by way of the etching solution of the invention, a surface texturization could be achieved that reflected only a very low amount of light and could be very well passivated and contacted by the front and back side contacts of the solar cells. In addition to this, the etching solution of the invention had a simulated long bath life so that the throughput of wafers could be increased significantly and the costs of production significantly decreased.

Last but not least, the etching solution of the invention caused an increase of the efficiencies of the photovoltaic cells or solar cells manufactured from the silicon wafers texturized with the said solution.

Moreover, it was surprising that the method of the invention no longer exhibited the drawbacks of the prior art etching methods.

In particular, the method of the invention met the increasing demands of the solar cells industry and its customers. Furthermore, the method of the invention diluted yielded etched silicon substrates or wafers with an improved uniform color so that, in turn, solar cells having also an improved uniform color could be produced. This is particularly important, when such solar cells are to be used in urban areas. Additionally, the method of the invention led to a much less pronounced grain boundary etching and to a significantly higher mechanical stability of the silicon wafers and of the solar cells produced therefrom, in particular during their production and handling. Moreover, the method of the invention yielded a surface texturization that reflected only a very low amount of light and could be very well passivated and contacted by the front and back side contacts of the solar cells. In addition to this, the method of the invention led to a high throughput of wafers and low production costs.

Last but not least, the method of the invention yielded texturized silicon wafers which, in turn, gave photovoltaic cells or solar cells with increased efficiencies.

Moreover, it was particularly surprising that the etching solution of the invention and the anionic polyether surfactants could be most advantageously utilized for the uses of the invention.

The solution of the invention was particularly suitable for single-sided etching processes and the production of debonding areas in the manufacture of devices generating electricity upon the exposure to electromagnetic radiation, for the production of rough surfaces as used in wafer bonding processes, for the production of bactericidal structures, and for the production of anti-adhesive structures.

DETAILED DESCRIPTION OF THE INVENTION

The solution and the etching solution of the invention contain the essential components hydrofluoric acid, nitric acid, at least one anionic polyether surfactant and water, preferably, in the concentrations set out below.

The concentration of the hydrofluoric acid in the etching solution of the invention can vary broadly and, therefore, can be adjusted most advantageously to the particular requirements of given solutions, etching solutions, methods, methods of manufacturing and uses of the invention. Preferably, the etching a solution on the invention contains the hydrofluoric acid in amounts of from 0.5 to 50% by weight, more preferably 1 to 30% by weight, even more preferably 2 to 20% by weight, and, most preferably, 3 to 15% by weight, the weight percentages being based on the complete weight of the solution or the etching solution of the invention.

Likewise, the concentration of the nitric acid in the etching solution of the invention can vary broadly and, therefore, can be adjusted most advantageously to the particular requirements of given solutions, etching solutions, methods, methods of manufacturing and uses of the invention. Preferably, the etching solution contains 0.5 to 50% by weight, more preferably, 5 to 40% by weight, even more preferably 5 to 30% by weight and, most preferably, 10 to 25% by weight, the weight percentages being based on the complete weight of the solution or the etching solution of the invention.

The solution and the etching solution of the invention contain at least one, preferably one, anionic polyether which is surface active.

"Surface active" means that the anionic polyether should have a sufficient surface activity. Such anionic polyethers may also be anionic polyether surfactants. Such surfactants usually reduce the surface tension to values below 50 mN/m and they are capable of forming micelles. However, the anionic polyether which is surface active and to be used in accordance with the present invention is not limited to such surfactants.

Preferably, the anionic polyether surfactant is selected from the group consisting of water-soluble and water-dispersible, preferably water-soluble, linear and branched, alkylene oxide homopolymers and copolymers and mixtures thereof.

In the the linear alkylene oxide homopolymer or copolymer at least one, preferably one, end group is an anionic group and, preferably, both end groups are anionic groups.

The end group is selected from the group consisting of carboxylate, sulfonate, sulfate, phosphate, diphosphate, phosphonate, and polyphosphate groups, preferably sulfate and phosphate, most preferably sulfate groups.

In the branched alkylene oxide homopolymer or copolymer, the end group of at least one branch is an anionic group selected from the group consisting of carboxylate, sulfonate, sulfate, phosphate, diphosphate, phosphonate, and polyphosphate groups, preferably sulfate and phosphate groups and, most preferably, sulfate groups.

Most preferably, on the average at least 40%, more preferably at least 50%, most preferably, more than 70% of the end groups of a given branched alkylene oxide homopolymer or copolymer are anionic groups.

Preferably, the remaining end groups are hydroxy groups. However, a minor part of the remaining hydroxy groups may be converted to nonionic end groups such as ether or ester groups. "Minor part" means that the remaining hydroxy groups are converted to such a degree that the water solubility of the branched alkylene oxide homopolymer or copolymer is not jeopardized.

In addition, the surface active polyether can also bear anionic groups as lateral side groups distributed along the polyether chain. The anionic groups are same as described above.

Between polyether and anionic groups also spacer groups can exist. They can contain 1-18 carbon atoms.

The linear and branched alkylene oxide copolymers contain the comonomer units in statistical, alternating or block-like distribution. At least two of these distributions may be present in a linear alkylene oxide copolymer or in at least one branch of a branched alkylene oxide copolymer.

Preferably, the alkylene oxide is selected from the group consisting of ethyleneoxide, propyleneoxide and mixtures thereof.

Higher alkylene oxides having more than 3 carbon atoms such as butylene oxide, isobutylene oxide, pentene oxide or styrene oxide may be used. However such higher alkylene oxides are only used in minor amounts which do not jeopardize the water-solubility or -dispersibility of the relevant linear and branched alkylene oxide copolymers.

The branched alkylene oxide homopolymers and copolymers are preparable by polymerizing one alkylene oxide or copolymerizing at least two different alkylene oxides using at least one polyol having at least three, preferably at least four hydroxy groups as the starter molecule and converting the hydroxy end group of at least one branch into one of the anionic groups described hereinbefore.

In principle, any monomeric, dimeric, oligomeric or polymeric polyol can be used.

Suitable oligomeric and polymeric polyols are hydroxy groups containing oligomers or polymers such as polyvinyl alcohol, poly(hydroxystyrene) or poly(hydroxyalkyl(meth) acrylates).

Preferably, the polyol is selected from the group consisting of aliphatic, cycloaliphatic and aromatic polyols, dimers, oligomers and polymers thereof.

More preferably, the aliphatic polyol is selected from the group consisting of glycerol, trimethylolpropane, 1,2,3-trihydroxy-n-butane, erythritol, pentaerythritol, alditols, hexitols, heptitols, octitols, dimers, oligomers and polymers thereof, and mixtures thereof.

More preferably, the cycloaliphatic polyols are selected from the group consisting of quinic acid, sugar acids, cyclic sugars, cycloaliphatic compounds having at least three hydroxy groups, dimers, oligomers and polymers thereof, and mixtures thereof.

More preferably, the aromatic polyols are selected from the group consisting of phenols having at least three hydroxy groups.

Most preferably, pentaerythritol or tripentaerythritol are used as the starter molecules.

Therefore, the branched alkylene oxide homopolymers or copolymers to be used in the composition of the invention has at least three and more preferably at least four branches.

The molecular weight of the linear and branched alkylene oxide homopolymers and copolymers can vary broadly and, therefore, can be adjusted most advantageously to the particular requirements of etching solutions, methods, manufacturing methods and uses of the invention. However, the molecular weight should not be too high so that the etching solution of the invention is not rendered too viscous and/or the alkylene homopolymers and copolymers cannot be removed easily from the texturized surface created by the method of the invention and/or the concentration of the anionic groups becomes so low that the polymers or copolymers no longer exhibit surfactant properties.

Preferably, the average degree of polymerization of the linear alkylene oxide homopolymers and copolymers is in the range of 5 to 200, more preferably 6 to 150 and, most preferably, 7 to 100.

Preferably, the average degree of polymerization of the branches of the branched alkylene oxide homopolymers and copolymers is in the range of from 5 to 50, preferably 5 to 40, more preferably 5 to 30 and, most preferably, 5 to 20.

The concentration of the alkylene oxide homopolymer or copolymer in the solution and the etching solution of the invention can vary broadly, and, therefore, can be adjusted most advantageously to the particular requirements of solutions, etching solutions, methods, manufacturing methods and uses of the invention. Preferably, the alkylene oxide homopolymer or copolymer is used in amounts of from 1 ppm 0.1% by weight, preferably 5 ppm to 500 ppm, more preferably 10 to 200 ppm and, most preferably, 20 to 100 ppm, based on the complete weight of the etching solution of the invention.

The solution and the etching solution of the invention can furthermore contain at least one acid, preferably at least two acids, different from hydrofluoric acid and nitric acid.

Preferably, the acid is selected from the group consisting of inorganic acids and organic carboxylic, sulfonic and phosphonic acids.

More preferably, inorganic acids are used. Most preferably, the inorganic acid is selected from the group consisting of sulfuric acid, hexafluorosilicic acid, and mixtures thereof.

If used, the concentration of sulfuric acid in the solution and the etching solution of the invention is preferably in the range of from 1 to 60% by weight and most preferably 5 to 50% by weight, the weight percentages being based on the complete weight of the solution or the etching solution of the invention.

When the etching solution of the invention is used in the method of the invention, a certain concentration of hexafluorosilicic acid establishes, the hexafluorosilicic acid being produced by the texturizing and partial dissolution of silicon. Preferably, the concentration of hexafluorosilicic acid in the etching solution of the invention does not exceed 10% by weight, based on the complete weight of the etching solution of the invention.

The preparation of the etching solution of the invention does not offer any particularities but can be carried out by adding the ingredients described hereinbefore in the desired amounts to water, in particular deionized water. For this purpose, the customary and standard mixing processes and acid corrosion resistant mixing devices such as agitated vessels, in-line, dissolvers, high shear impellers, ultrasonic mixers, homogenizer nozzles or counterflow mixers can be used. Preferably, high purity chemicals are used.

According to the uses of the invention, the etching solution of the invention is particularly useful for manufacturing electrical, mechanical and optical devices, the said devices requiring high precision etching in the process of their manufacture.

Such electrical devices may be devices which generate electricity upon exposure to electromagnetic radiation, integrated circuit devices, liquid crystal panels, organic electroluminescent panels, printed circuit boards, micro machines, DNA chips, micro plants and magnetic heads; the mechanical devices may be high precision mechanical devices; and the optical devices may be optical glasses such as photo-masks, lenses and prisms, inorganic electro-conductive films such as indium tin oxide (ITO), optical integrated circuits, optical switching elements, optical waveguides, optical monocrystals such as the end faces of optical fibers and scintillators, solid laser monocrystals, sapphire substrates for blue laser LEDs, semiconductor monocrystals, and glass substrates for magnetic disks.

Most particularly, the etching solution of the invention is exceptionally useful for manufacturing devices which generate electricity upon exposure to with electromagnetic radiation, in particular solar radiation.

Moreover, according to the uses of the invention, the anionic polyether surfactants described hereinbefore are exceptionally useful for manufacturing devices generating electricity upon the exposure to electromagnetic radiation, in particular solar radiation.

Therefore, according to the uses of the invention, the etching solution of the invention and the anionic polyether surfactants described hereinbefore are most particularly useful for manufacturing photovoltaic cells and solar cells, especially solar cells.

Thus, the etching solution of the invention is particularly useful and suitable for texturizing the surface of single crystal and polycrystal silicon substrates, including single crystal and polycrystal silicon alloy substrates, in particular silicon germanium alloy substrates.

Most preferably, the single crystal and polycrystal silicon substrates are wafers useful for manufacturing photovoltaic or solar cells. Such wafers can have different sizes.

Preferably, they are 100 to 210 mm square or pseudosquare. Likewise, the thickness of the wafers can vary. Preferably, the thickness is in the range of 80 to 300 µm.

After their production, the wafers are customarily checked for breakages and other errors, and are sorted into the solar cell production process.

In the first step of the method of the invention, at least one major surface and, preferably, the two major surfaces lying opposite to each other of the single crystal or polycrystal silicon substrate are contacted with the etching solution of the invention.

This can be accomplished, for example, by dipping at least one silicon substrate in its entirety either horizontally or vertically in a tank filled with the etching solution of the invention or by conveying at least one silicon substrate essentially horizontally through the tank filled with the etching solution of the invention, as described, for example, in the American patent U.S. Pat. No. 7,192,885 B2.

In the second process step of the method of the invention, the at least one, preferably one major surface of the substrate is etched for a time and at a temperature sufficient to obtain the surface texturization consisting of recesses and protrusions.

Preferably, the etching time is from 1 to 10 minutes, more preferably from 1 to 7.5 minutes and, most preferably, from 1 to 5 minutes.

Preferably, the etching temperature is in the range of from 0 to 50° C., more preferably, from 0 to 40° C. and most preferably from 0 to 30° C.

Preferably, the surface texturization obtained by way of the method of the invention consists of a multitude of pits preferably having a depth in the range of from 0.1 to 15 µm, preferably 0.1 to 10 µm.

"Multitude" means more than 50%, preferably more than 75%, even more preferably more than 90% of the pits or all of the pits.

More preferably, the pits have a diameter in the range of from 0.1 to 15 µm, preferably 0.1 to 10 µm.

Even more preferably, the pits have a depth in the range of from 0.1 to 15 µm, preferably 0.1 to 10 µm and a diameter in the range of from 0.1 to 15 µm, preferably 0.1 to 10 µm.

Particularly preferably, the pits are closed to more than 180°.

Particularly preferably, the pits are deeper than wide at least in one direction.

Most particularly preferably, the cross section of the pits has a rounded profile.

Due to the etching solution, the method of the invention can be carried out comparatively fast leading to decreased production costs.

Therefore, the etching solution and the method of the invention are particularly well suited for the manufacture of mechanically stable devices, which generate electricity upon the exposure to electromagnetic radiation in accordance with the manufacturing method of the invention. In particular, the electromagnetic radiation concerned is solar light, and the devices are photovoltaic cells or solar cells.

The manufacturing method of the invention yields devices, in particular solar cells, of high efficiencies and a uniform appearance in exceptionally high yields.

The solution of the invention is highly versatile and can be used for numerous applications.

Thus, the solution of the invention is particularly suitable for single-sided etching processes and the production of debonding areas in the manufacture of devices generating electricity upon the exposure to electromagnetic radiation, in particular photovoltaic cells and solar cells. In this regard, the solution of the invention is especially suitable for wet edge isolation processes carried out after the emitter diffusion processes creating in particular boron or phosphorus emitters.

Moreover, the solution of the invention is particularly suitable for the production of debonding areas. Such debonding areas are used for example in various silicon production methods.

Additionally, the solution of the invention is particularly suitable for the production of rough surfaces as needed for example in wafer bonding processes.

Furthermore, the solution of the invention is particularly suitable for the production of bactericidal and/or anti-adhesive structures. Such structures are preferably located on the surface of all kind of substrates which may be composed of metals, ceramics, semiconductors, glass and/or synthetic materials. An advantageous method to impart formed parts of synthetic materials with such bactericidal and/or anti-adhesive surfaces includes the treatment of the inner surface of the respective moulds with the solution of the invention.

EXAMPLES AND COMPARATIVE EXPERIMENTS

Examples 1 to 5 and Comparative Experiments C1 and C2

The Preparation of Aqueous Acidic Etching Solutions Containing Anionic Polyether Surfactants (Examples 1 to 5) or Nonionic Surfactants (Comparative Experiments C1 and C2)

The aqueous acidic etching solutions of the examples 1 to 5 and of the comparative experiments C1 and C2 were prepared by dissolving their ingredients in the desired amounts in ultra pure water.

Table 1 shows the ingredients and the amounts used.

TABLE 1

The Acidic Etching Solutions Containing Anionic Polyether Surfactants (Examples 1 to 5) or Nonionic Surfactants (Comparative Experiments C1 and C2)

| Example Comparative Experiment No. | Hydrofluoric Acid/% by Weight | Nitric Acid/% by Weight | Sulfuric Acid/% by Weight | Surfactant | Amount of Surfactant |
|---|---|---|---|---|---|
| C1 | 6 | 18.8 | 18.6 | 1-amino-3-propanol | 0.2% by weight |
| C2 | 6 | 18.8 | 18.6 | Hexynediol | 0.2% by weight |
| 1 | 6 | 18.8 | 18.6 | B18[a] | 40 ppm |
| 2 | 11.7 | 30.3 | — | B18[a] | 40 ppm |
| 3 | 6 | 18.8 | 18.6 | B20[b] | 40 ppm |
| 4 | 6 | 18.8 | 18.6 | B22[c] | 40 ppm |
| 5 | 6 | 18.8 | 18.6 | B23[d] | 40 ppm |

[a]Branched ethyleneoxide-propyleneoxide copolymer based on tripentaerythritol as the starter molecule having 8 branches, each branch having, on the average, 3 units derived from ethyleneoxide units and about 5-6 units derived from propyleneoxide wherein, on the average, 70 to 80% of the end groups are sulfate groups;
[b]Branched ethyleneoxide-propyleneoxide copolymer based on tripentaerythritol as the starter molecule having 8 branches, each branch having, on the average, 3 units derived from ethyleneoxide units and about 5-6 units derived from propyleneoxide wherein, on the average, about 4 end groups are sulfate groups;
[c]Branched ethyleneoxide homopolymer based on tripentaerythritol as the starter molecule having 8 branches, each branch having, on the average, 8-9 units derived from ethyleneoxide, wherein, on the average, 70 to 80% of the end groups are sulfate groups;
[d]Linear ethyleneoxide-propyleneoxide copolymer having, on the average, 25-26 units derive from ethyleneoxide and, on the average, 29-31 units derived from propyleneoxide, wherein both end groups are sulfate groups Examples 6 to 10 and Comparative Experiments C3 and C4

The Etching Behavior of Aqueous Acidic Etching Solutions Containing Anionic Polyether Surfactants (Examples 6 to 10) or Nonionic Surfactants (Comparative Experiments C3 and C4)

Screening tests for determining the etching behavior and the quality of the texturization were carried out in temperature controlled polytetrafluoroethylene (PFA) beakers at 8° C. or 20° C. To this end, each beaker was filled with an aqueous acidic etching solution containing an anionic polyether surfactant (examples 6 to 10) or a nonionic surfactant (comparative experiments C3 and C4). Pieces of polycrystalline silicon wafers having a size of about 2×2 cm² were positioned horizontally in the solutions by using PFA tweezers.

The amounts which were etched away were determined by measuring the weight of the silicon wafer pieces before and after etching.

The quality of the etch results were inspected visually after removing about 4.5 µm of silicon on each side. To this end, the degree of defect etching on the top side and the bottom inside of each wafer was qualitatively assessed and graded " low" or "high".

The results obtained are compiled in the Table 2.

TABLE 2

The Etching Behavior of Aqueous Acidic Etching Solutions Containing Anionic Polyethers Which Are Surface Active (Examples 6 to 10) or Nonionic Surfactants (Comparative Experiments C3 and C4)

| Example or Comparative Experiment No. | Solution from Example or Comparative Experiment No. | Etch Rate/µm/min x side | Degree of Defect Etching on Top Side | Degree of defect etching on Bottom Side |
|---|---|---|---|---|
| C3 | C1 | 1.4[a] | High | High |
| C4 | C2 | 1.4[a] | High | High |
| 6 | 1 | 1[b] | Low | Low |
| 7 | 2 | 0.8[b] | Low | Low |
| 8 | 3 | 0.6[b] | Low | Low |
| 9 | 4 | 0.6[b] | Low | Low |
| 10 | 5 | 0.6[b] | Low | Low |

[a]solution held at 8° C.;
[b]solution held at 20° C.

The texturizations obtained in the examples 6 to 10 were inspected by electron microscopy. The texturizations consisted of a multitude of pits closing at more than 180° and having a depth of up to 10 µm and being deeper than wide.

Due to these texturizations, the reflectivity in the wavelength region of from 400 to 1100 nm could be reduced by a more than 6% from about 26% in the non-texturized state to about 20%.

Moreover, wafers texturized with the aqueous acidic etching solutions of the examples 1 to 5 exhibited very low breakage rates.

Therefore, the aqueous acidic etching solutions containing anionic polyether surfactants were excellently suited for the manufacture of solar cells having high efficiencies.

Example 11

The Etching Behavior of an Aqueous Acidic Etching Solution Containing an Anionic Polyether Which Is Surface Active and Hexafluorosilicic Acid For the example 11, an aqueous acidic etching solution was prepared, the said solution comprising 6% by weight hydrofluoric acid, 18.6% by weight nitric acid, 11.1% by weight sulfuric acid, 2.4% by weight silicon in the form of hexafluorosilicic acid (12.3%) and 35 ppm of the anionic polyether surfactant B18 (cf. the Table 1).

The etching behavior and the quality of the etching results were determined as described in the examples 6 to 10.

The hexafluorosilicic acid containing etching solution showed an etching rate of 1.9 µm/minxside at 20° C. The quality of the etch results were not as excellent as those obtained with the hexafluorosilicic acid-free etching solutions of the examples 1 to 5. Nevertheless, the quality of the texturization indicated that the load of hexafluorosilicic acid could be increased even further so that exceptionally long bath lives could be obtained in the industrial manufacture of solar cells.

We claim:
1. An aqueous acidic solution comprising:
   2-50% hydrofluoric acid;
   nitric acid; and
   at least one polymeric surface active anionic polyether selected from the group consisting of linear and branched surface active anionic polyether copolymers,
   wherein said solution provides pits, more than 50% of said pits having a depth in the range of from 0.1 to 15 µm and a diameter in the range of from 0.1 to 15 µm, on a surface of both single crystal and polycrystal silicon substrates when said solution is contacted with said surface for 1 to 10 minutes at a temperature of from 0 to 50° C.

2. The aqueous acidic solution according to claim 1, wherein the polymeric surface active anionic polyether is selected from the group consisting of a linear water soluble and water dispersible alkylene oxide copolymer, a branched water soluble and water dispersible alkylene oxide copolymer, and any mixture thereof;
   at least one end group of the linear alkylene oxide copolymer is an anionic group selected from the group consisting of a carboxylate group, a sulphate group, a sulfonate group, a phosphate group, a diphosphate group, a phosphonate group, and a polyphosphate group; and
   an end group of at least one branch of the branched alkylene oxide copolymer is an anionic group selected from the group consisting of a carboxylate group, a sulphate group, a sulfonate group, a phosphate group, a diphosphate group, a phosphonate group, and a polyphosphate group.

3. The aqueous acidic solution according to claim 2, wherein the end group of the linear or branched alkylene oxide copolymer is a sulfate group.

4. The aqueous acidic solution according to claim 2, wherein at least 40% of the end groups of a branched alkylene oxide copolymer are anionic groups.

5. The aqueous acidic solution according to claim 2, wherein the anionic polyether is a copolymer selected from the group consisting of an ethyleneoxide, a propyleneoxide, and any mixture thereof.

6. The aqueous acidic solution according to claim 2, wherein the linear and branched alkylene oxide copolymers comprise comonomer units in a statistical, alternating or blocklike distribution.

7. The aqueous acidic solution according to claim 2, wherein the branched alkylene oxide copolymers are prepared by a process comprising:
   copolymerizing at least 2 different alkylene oxides using at least one polyol comprising at least 3 hydroxy groups as a starter molecule; and
   converting one hydroxy end group of at least one branch into an anionic group.

8. The aqueous acidic solution according to claim 7, wherein the at least one polyol is an aliphatic, a cycloaliphatic, or an aromatic polyol,
   an aliphatic, a cycloaliphatic, or an aromatic oligomer, or an aliphatic, a cycloaliphatic, or an aromatic polymer.

9. The aqueous acidic solution according to claim 1, comprising, based on a complete weight of the solution, 1 ppm to 0.1% by weight of the polymeric surface active anionic polyether.

10. The aqueous acidic solution according to claim 1, comprising, based on a complete weight of the solution, 0.5 to 50% by weight of the hydrofluoric acid.

11. The aqueous acidic solution according to claim 1, comprising, based on a complete weight of the solution, 3 to 15% by weight of the nitric acid.

12. The aqueous acidic solution according to claim 1, further comprising an acid different from the hydrofluoric and the nitric acid.

13. The aqueous acidic solution according to claim 12, wherein the acid is selected from the group consisting of an acetic acid, a sulfuric acid, a phosphoric acid and a hexafluorosilicic acid.

14. A structure comprising the aqueous acidic solution according to claim 1,
wherein the structure is debonding areas in manufacturing devices generating electricity upon exposure to electromagnetic radiation in a single filed etching process,
rough surfaces in wafer bonding processes,
a bactericidal structure, or
an anti-adhesive structure.

15. A method of texturizing surface of single crystal and polycrystal silicon substrates, the method comprising:
(i) contacting at least one major surface of a single crystal or polycrystal silicon substrate with the aqueous acidic etching solution according to claim 1;
(ii) etching the at least one major surface of the single crystal or polycrystal silicon substrate for a time and at a temperature sufficient to obtain a surface texturization comprising recesses and protrusions; and
(iii) separating the at least one major surface of the single crystal or polycrystal silicon substrate from the aqueous acidic etching solution.

16. The method according to claim 15, wherein two opposite major surfaces of the single crystal or polycrystal silicon substrate are contacted with the aqueous acidic etching solution in said contacting (i).

17. The method according to claim 16, wherein the single crystal or polycrystal silicon substrate is dipped entirely into the aqueous acidic etching solution in said contacting (i).

18. The method according to claim 15, wherein the at least one major surface of the single crystal or polycrystal silicon substrate is etched for 1 to 10 minutes at a temperature of from 0 to 50° C. in said etching (ii).

19. The method according to claim 15, wherein the surface texturization obtained in said etching (ii) comprising a multitude of pits having a depth in a range of from 0.1 to 15 µm and a diameter in a range of from 0.1 to 15 µm.

20. The method according to claim 19, wherein the pits are closed to more than 180°.

21. The method according to claim 19, wherein a depth of the pits is larger than a width of the pits in at least one direction.

22. The method according to claim 19, wherein the pits are elongated depressions.

23. The method according to claim 15, wherein the single crystal or polycrystal silicon substrate is entirely removed from the aqueous acidic etching solution in said separating (iii).

24. A method of manufacturing devices generating electricity upon exposure to electromagnetic radiation, the method comprising texturizing the surface of single crystal and polycrystal silicon substrates according to the method of claim 15.

25. The method of claim 24, wherein the electromagnetic radiation is solar light.

26. The method of claim 25, wherein the devices are photovoltaic cells or solar cells.

27. A device comprising the aqueous acidic etching solution according to claim 1, wherein the device is an electrical, a mechanical, or an optical device.

28. A device generating electricity upon exposure to electromagnetic radiation comprising at least one polymeric surface active anionic polyether.

29. The aqueous acidic solution according to claim 1, comprising, based on a complete weight of the solution:
2 to 50% by weight of the hydrofluoric acid;
0.5 to 50% by weight of the nitric acid; and
1 ppm to 0.1% by weight of the polymeric surface active anionic polyether.

30. The aqueous acidic solution according to claim 1, wherein the polymeric surface active anionic polyether is selected from water soluble and water dispersible linear and branched alkylene oxide copolymers, and mixtures thereof.

31. The aqueous acidic solution according to claim 30, wherein the average degree of polymerization of the linear alkylene oxide copolymers is in the range of 5 to 200, and the average degree of polymerization of the branches of the branched alkylene oxide copolymers is in the range of from 5 to 50.

* * * * *